US008168050B2

(12) United States Patent
Lu

(10) Patent No.: US 8,168,050 B2
(45) Date of Patent: May 1, 2012

(54) ELECTRODE PATTERN FOR RESISTANCE HEATING ELEMENT AND WAFER PROCESSING APPARATUS

(75) Inventor: Zhong-Hao Lu, Chagrin Falls, OH (US)

(73) Assignee: Momentive Performance Materials Inc., Albany, NY (US)

( * ) Notice: Subject to any disclaimer, the term of this patent is extended or adjusted under 35 U.S.C. 154(b) by 1246 days.

(21) Appl. No.: 11/539,880

(22) Filed: Oct. 10, 2006

(65) Prior Publication Data

US 2008/0029195 A1 Feb. 7, 2008

Related U.S. Application Data

(60) Provisional application No. 60/806,620, filed on Jul. 5, 2006.

(51) Int. Cl.
*C23C 14/50* (2006.01)

(52) U.S. Cl. .............. 204/298.15; 204/298.09; 118/715; 118/724; 118/725; 118/728; 438/584; 438/758; 269/903

(58) Field of Classification Search ............. 204/298.09, 204/298.15; 118/715, 724, 725, 728; 428/758, 428/584; 269/903
See application file for complete search history.

(56) References Cited

U.S. PATENT DOCUMENTS

| | | | | |
|---|---|---|---|---|
| 5,904,872 | A * | 5/1999 | Arami et al. | 219/444.1 |
| 6,242,719 | B1 * | 6/2001 | Kano et al. | 219/444.1 |
| 7,417,206 | B2 * | 8/2008 | Nakamura | 219/444.1 |
| 2002/0185488 | A1 | 12/2002 | Natsuhara et al. | 219/444.1 |
| 2004/0016746 | A1 * | 1/2004 | Ito et al. | 219/444.1 |
| 2004/0112888 | A1 * | 6/2004 | Tachikawa et al. | 219/468.1 |

FOREIGN PATENT DOCUMENTS

| | | | |
|---|---|---|---|
| JP | 09-007741 | A | 1/1997 |
| JP | 11-317283 | | 11/1999 |
| JP | 2002-313530 | A | 10/2002 |
| JP | 2003-373846 | | 12/2002 |
| JP | 2003-133032 | A | 5/2003 |
| JP | 2003-282393 | A | 10/2003 |
| JP | 2004-146570 | | 5/2004 |

OTHER PUBLICATIONS

Translation of Nov. 29, 2011 Japanese Office action for Japanese Application No. 2006-323726.
Machine Translation of JP 2002-313530.
Machine Translation of JP 2003-282393.
Machine Translation of JP 2003-133032.
Machine Translation of JP-09-007741.

* cited by examiner

*Primary Examiner* — Keith Hendricks
*Assistant Examiner* — Jason M Berman
(74) *Attorney, Agent, or Firm* — Joseph E. Waters

(57) ABSTRACT

There is disclosed a wafer processing apparatus having optimized electrode patterns for its resistive heating element. The optimized electrode pattern is designed to compensate for the heat loss around contact areas, electrical connections, and through-holes, etc., by generating more heat near or around those areas, providing maximum temperature uniformity. In another embodiment of the optimized design of the invention, the resistance of heating element closely matches the impedance of the power supply for higher efficiency, especially when higher operating temperature or higher electrical power is required.

18 Claims, 4 Drawing Sheets

ELECTRODE PATTERN FOR RESISTANCE HEATING ELEMENT AND WAFER PROCESSING APPARATUS

CROSS REFERENCE TO RELATED APPLICATION

This application claims the benefits of U.S. 60/806,620 filed Jul. 5, 2006, which patent application is fully incorporated herein by reference.

FIELD OF INVENTION

The invention relates to a circuit pattern of resistance heating elements embedded in a wafer processing apparatus for use in the manufacture of semiconductors.

BACKGROUND OF THE INVENTION

Wafer processing apparatuses are used to treat wafers in film making systems such as plasma CVD, low pressure CVD, optical CVD or PVD systems, or in etching systems based on plasma etching or optical etching technique, particularly, for production of semiconductor devices. Ceramic heaters containing heating elements have been used to support the wafers and substrates and to heat them to a specified treating temperature. The electrode pattern design of heating elements directly affects the performance of the heating unit, which is defined as ramp rate, operating temperature, and most importantly temperature uniformity.

Poor uniformity of the heating elements in the wafer processing apparatus results in significant unevenness in heating of the supporting surface as a whole, thus failing to heat the wafer uniformly. Consequently, when a film is formed by using the wafer processing apparatus, the film cannot be formed with a uniform thickness on the wafer and, in the case of etching process, there have been problems as significant variations in the processing accuracy, resulting in poor product yield.

Attempts have been made in the prior art to better design the circuit pattern, i.e., the electrode pattern of ceramic heaters. Japanese Patent Publication No. 11-317283 discloses a circuit pattern that is composed of at least two linear resistance-heating elements connected in parallel to improve the temperature distribution of a ceramic heater. Japanese Patent Publication No. 2004-146570 discloses a ceramic heater in which the resistance heating elements are wired mutually, and wherein the distance between each adjacent heating element is 1-5 mm. Japanese Patent Publication No. 2002-373846 discloses a ceramic heater in which the heating elements have different circuit pattern intervals for forming a wide heat accumulation prevention area. In another reference, US Patent Publication No. 2002-185488 discloses a ceramic heater having alternate arrangements of resistance heating elements formed from central and outermost portions of the insulating substrate.

The present invention directs to an approach to design and optimize the circuit pattern of the heating elements in wafer heating apparatuses. In one embodiment of an optimized circuit design, the power density generated by the electrode closely matches the heat loss defined by the heat transfer boundary conditions of the heater. Additionally in another embodiment, the resistance of heating element closely matches the impedance of the power supply for higher efficiency, particularly under processing conditions wherein higher operating temperature or higher electrical power is required.

SUMMARY OF THE INVENTION

In one aspect, the invention relates to a design rule for the electrode pattern at the electrical contacts where the electrical connections to the power supplies are made. At the electrical contacts, more power is needed to compensate for the lack of heat generated in the contact areas and possible additional heat loss through the electrical connections. In one embodiment of an electrode, the electrode is designed such that more heat is generated by at least one of: a) connecting to the contacts from one side and circling around the contact if there is adequate space near the contact areas; and b) reducing the width at the connection to a range from 0.45 to 0.8 of the width of the path width if there is not enough space near the contacts.

In another aspect of the invention, the electrode pattern is optimized for a wafer processing apparatus having relative large tabs. Due to structure limitation of a tab, electrodes typically do not extend to cover the surface of the tabs. In one embodiment, the width of the outermost electrode path is reduced to a range from 0.5 to 0.95 of its original width, for an adjusted width reduction such that the main heater area is insulated from the heat loss at the tabs allowing uniform surface temperature to heat the wafer.

In one aspect, the electrode pattern is optimized around supporting holes, pin holes, etc., of the wafer processing apparatus. In these designs, the electrode width is reduced to generate more power near or around the holes, with the width reduction ranging from 0.30 to 0.70 depending on the location of the holes relative to the location of the path turns. In one embodiment wherein the holes are located near the edge of the heater (e.g., supporting holes), the width of the electrode path is reduced to a range from 0.4 to 0.75 of the normal-path width without holes. In a second embodiment for relatively large holes, the electrode pattern is arranged such that the paths meet and turn back in opposite directions at the holes.

In yet another aspect, the invention relates to a wafer processing apparatus having a multi-zone heater pattern with different geometries and specification for each zone, operating in a non-uniform boundary condition environment but still obtaining uniform heater temperature distribution. In the heater, the two heating zones are designed to compensate for the additional heat loss on the outer peripheral edge of the heater provide radial temperature uniformity, with the outermost path in the first zone has a width ranging from 0.6 to 0.95 of the width of the inner path in the second zone of the electrode.

DETAILED DESCRIPTION OF THE INVENTION

As used herein, approximating language may be applied to modify any quantitative representation that may vary without resulting in a change in the basic function to which it is related. Accordingly, a value modified by a term or terms, such as "about" and "substantially," may not to be limited to the precise value specified, in some cases.

As used herein, the term "substrate" and "wafer" may be used interchangeably; referring to the semiconductor wafer substrate being supported/heated by the apparatus of the invention. Also as used herein, the "treating apparatus" may be used interchangeably with "handling apparatus," "heating apparatus," "heater," or "processing apparatus," referring to an apparatus containing at least one heating element to heat the wafer supported thereon.

As used herein, the term "circuit" may be used interchangeably with "electrode," and the term "resistance heating element" may be used interchangeably with "resistor," "heating resistor," or "heater." The term "circuit" may be used in either the single or plural form, denoting that at least one unit is present.

As used herein, a component having a closely matched coefficient of thermal expansion (CTE) means that the CTE of the component is between 0.75 to 1.25 of the CTE of the adjacent layer or another component adjacent to it.

Embodiments of the wafer processing apparatus employing resistance heating elements having the optimized circuit design of the invention are illustrated as follows, by way of a description of the materials being employed, the manufacturing process thereof and also with references to the figures.

Figure 8:
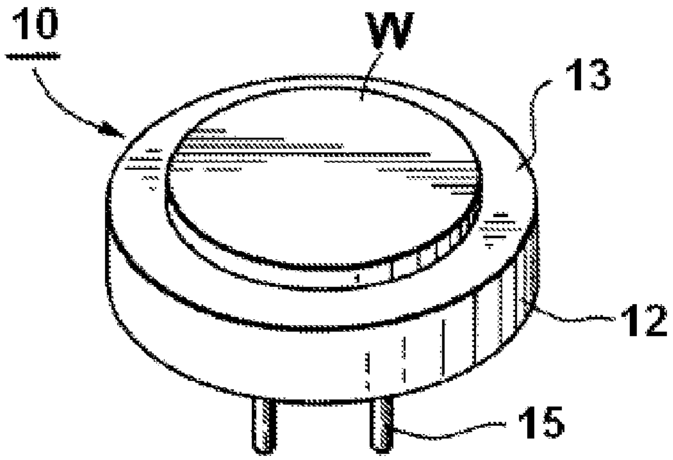
FIG. 8 is a perspective view showing one embodiment of a wafer or substrate treating apparatus.

General Embodiments of the Wafer Processing Apparatus: In one embodiment as illustrated in FIG. 8, a wafer processing apparatus refers to a disk-shaped dense ceramic substrate 12, whose top surface 13 serves as a supporting surface for a wafer W, having a heating resistor 16 buried therein (not shown). Electric terminals 15 for supplying electricity to the heating resistor can be attached at the center of the bottom surface of the ceramic substrate 12, or in one embodiment, at the sides of the ceramic substrate. The wafer W placed on the top surface 13 of the heater is uniformly heated by applying a voltage to the supply terminals 15, thereby causing the heating resistor to generate heat.

Figure 9A:
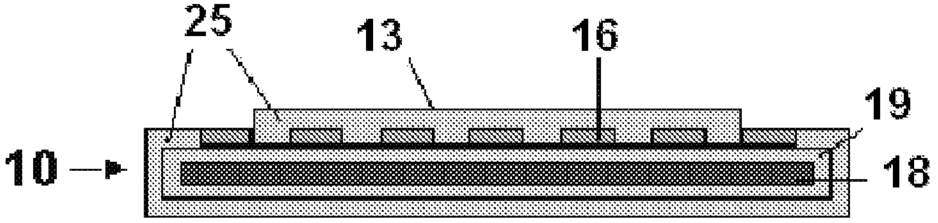
FIGS. 9A, 9B, and 9C are cross-sectional views of various embodiments of the substrate treating apparatus of FIG. 9, having different layered configurations.

With respect to the base substrate of the wafer processing apparatus of the invention, in one embodiment as illustrated in FIG. 9A, the base substrate comprises a disk or substrate 18 containing an electrically conductive material, having an overcoat layer 19 that is electrically insulating. The electrically conductive material the disk 18 is selected from the group of graphite; refractory metals such as W and Mo, transition metals, rare earth metals and alloys; and mixtures thereof. With respect to the overcoat layer 19 of the electrically conducting disk 18, the layer 19 comprises at least one of an oxide, nitride, carbide, carbonitride or oxynitride of elements selected from a group consisting of B, Al, Si, Ga, Y, refractory hard metals, transition metals; oxide, oxynitride of aluminum; and combinations thereof.

Figure 9B:
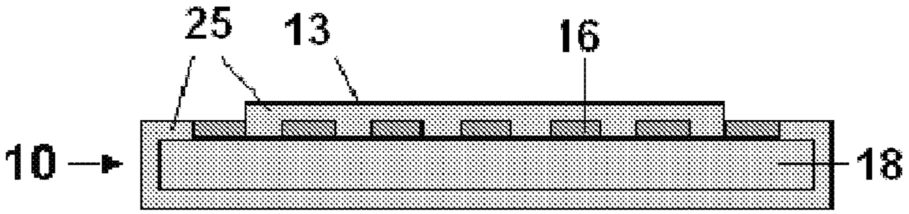

In one embodiment as illustrated in FIG. 9B, wherein the base substrate 18 comprises an electrically insulating material (i.e., a sintered substrate), the material is selected from the group of oxides, nitrides, carbides, carbonitrides or oxynitrides of elements selected from a group consisting of B, Al, Si, Ga, Y, refractory hard metals, transition metals; oxide, oxynitride of aluminum; and combinations thereof, having high wear resistance and high heat resistance properties. In one embodiment, the base substrate 18 comprises AlN, which has a high thermal conductivity of >50 W/mk (or sometimes >100 W/mk), high resistance against corrosion by corrosive gases such as fluorine and chlorine gases, and high resistance against plasma, in particular. In one embodiment, the base substrate comprises a high-purity aluminum nitride of >99.7% purity and a sintering agent selected from $Y_2O_3$, $Er_2O_3$, and combinations thereof.

Figure 9C:
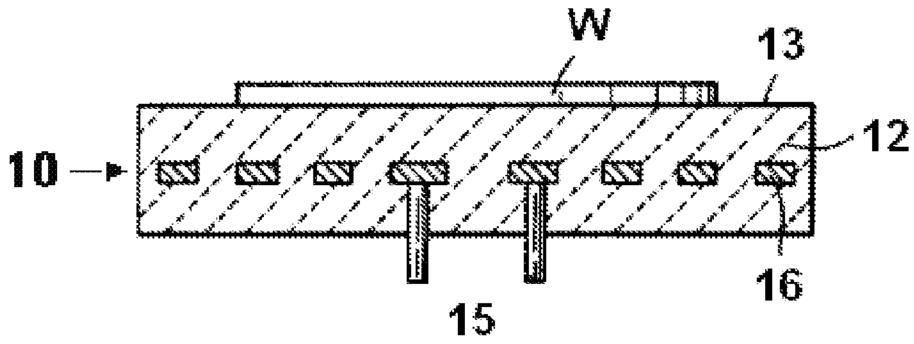

In one embodiment as illustrated in FIG. 9C, heating element 16 having an optimized circuit design is "buried" in the ceramic substrate 12. The heating element 16 comprises a material selected from metals having a high melting point, e.g., tungsten, molybdenum, rhenium and platinum or alloys thereof; carbides and nitrides of metals belonging to Groups IVa, Va and VIa of the Periodic Table and combinations thereof. In one embodiment, the heating element 16 comprises a material having a CTE that closely matches the CTE of the substrate (or its coating layer).

In the embodiments illustrated in FIGS. 9A-9B, the heating element comprises a film electrode 16 having a thickness ranging from about 5 microns to about 250 μm, which is formed on the electrically insulating base substrate 18 (of FIG. 9B) or the coating layer 19 (of FIG. 9A) by processes known in the art including screen-printing, spin coating, plasma spray, spray pyrolysis, reactive spray deposition, sol-gel, combustion torch, electric arc, ion plating, ion implantation, sputtering deposition, laser ablation, evaporation, electroplating, and laser surface alloying. In one embodiment, the film electrode 16 comprises a metal having a high melting point, e.g., tungsten, molybdenum, rhenium and platinum or alloys thereof. In another embodiment, the film electrode 16 comprises a noble metal or a noble metal alloy. In yet another embodiment, the electrode 16 comprises pyrolytic graphite.

In one embodiment, the sheet resistance of the electrode is controlled within a range of 0.01 to 0.03 Ω/square to meet the electrical resistance requirement for the electrode, while maintaining the optimal path width and space between the paths of the electrode pattern. The sheet resistance is defined as the ratio of electrical resistivity to film thickness.

In FIGS. 9A and 9B, the apparatus 10 is further coated with a protective coating film 25 which is etch-resistant, or having a low-etch rate in an environment comprising halogens or when exposed to plasma etching, reactive ion etching, plasma cleaning and gas cleaning. In one embodiment, the protective coating layer 25 has an etch rate of less than 1000 Angstroms per minute (Å/min) in a halogen-containing environment. In a second embodiment, this rate is less than 500 Angstroms per minute (Å/min). In a third embodiment, the rate is less than 100 Angstroms per minute (Å/min).

In one embodiment, the protective coating layer 25 comprises at least a nitride, carbide, carbonitride or oxynitride of elements selected from a group consisting of B, Al, Si, Ga, Y, refractory hard metals, transition metals, and combinations thereof, having a CTE ranging from $2.0\times10^{-6}$/K to $10\times10^{-6}$/K in a temperature range of 25 to 1000° C.

In a second embodiment, the protective coating layer 25 comprises a high thermal stability zirconium phosphates, having the NZP structure. The term NZP refers to $NaZr_2(PO_4)_3$, as well as to related isostructural phosphates and silicophosphates having a similar crystal structure. These materials in one embodiment are prepared by heating a mixture of alkali metal phosphates or carbonates, ammonium dihydrogen phosphate (or diammonium phosphate) and tetravalent metal oxides.

In one embodiment, the NZP-type coating layer 25 has a general formula: $(L,M1,M2,Zn,Ag,Ga,In,Ln,Y,Sc)_1$, $(Zr,V,Ta,Nb,Hf,Ti,Al,Cr,Ln)_m$ $(P,Si,VAl)_n(O,C,N)_{12}$ wherein L=alkali, M1=alkaline earth, M2=transition metal, Ln=rare earth and the values of 1, m, n are so chosen that a charge balance is maintained. In one embodiment, the NZP-type protective coating layer 25 includes at least one stabilizer selected from the group of alkaline earth oxides, rare earth oxides, and mixtures thereof. Examples include yttria ($Y_2O_3$) and calcia (CaO).

In one embodiment, the protective coating layer 25 contains a glass-ceramic composition containing at least one element selected from the group consisting of elements of the group 2a, group 3a and group 4a of the periodic table of element. The group 2a as referred to herein means an alkaline earth metal element including Be, Mg, Ca, Sr and Ba. The group 3a as referred to herein means Sc, Y or a lanthanoid element. The group 4a as referred to herein means Ti, Zr or Hf. Examples of suitable glass-ceramic compositions for use as the coating layer 25 include but are not limited to lanthanum aluminosilicate (LAS), magnesium aluminosilicate (MAS), calcium aluminosilicate (CAS), and yttrium aluminosilicate (YAS).

In one example, the protective coating layer 25 contains a mixture of $SiO_2$ and a plasma-resistant material comprising an oxide of Y, Sc, La, Ce, Gd, Eu, Dy, or the like, or a fluoride of one of these metals, or yttrium-aluminum-garnet (YAG). Combinations of the oxides of such metals, and/or combinations of the metal oxides with aluminum oxide, may be used. In a third embodiment, the protective coating layer 25 comprises from 1 to 30 atomic % of the element of the group 2a, group 3a or group 4a and from 20 to 99 atomic % of the Si element in terms of an atomic ratio of metal atoms exclusive of oxygen. In one example, the layer 25 includes aluminosilicate glasses comprising from 20 to 98 atomic % of the Si element, from 1 to 30 atomic % of the Y, La or Ce element, and from 1 to 50 atomic % of the Al element, and zirconia silicate glasses comprising from 20 to 98 atomic % of the Si element, from 1 to 30 atomic % of the Y, La or Ce element, and from 1 to 50 atomic % of the Zr element.

In another embodiment, the protective coating layer 25 is based on $Y_2O_3$—$Al_2O_3$—$SiO_2$ (YAS), with the yttria content varying from 25 to 55 wt. % for a melting point of less than 1600° C. and a glass transition temperature (Tg) in a narrow range of 884 to 895° C., with optional dopants added to adjust the CTE to match that of the adjacent substrate. Examples of dopants include BaO, $La_2O_3$, or NiO to increase the CTE of the glass, and $ZrO_2$ to decrease the CTE of the glass. In yet another embodiment, the protective coating layer 25 is based on BaO—$Al_2O_3$—$B_2O_3$—$SiO_2$ glasses, wherein $La_2O_3$, $ZrO_2$, or NiO is optionally added to adjust the CTE of the glass to appropriate match the CTE of the substrate. In one example, the coating layer 25 comprises 30-40 mol % BaO, 5-15 mole % $Al_2O_3$; 10-25 mole % $B_2O_3$, 25-40 mole % SiO2; 0-10 mole % of $La_2O_3$; 0-10 mole % $ZrO_2$; 0-10 mole % NiO with a molar ratio $B_2O_3/SiO_2$ ranging from 0.25 to 0.75.

The protective coating layer 25 can accommodate small concentrations of other non-metallic elements such as nitrogen, oxygen and/or hydrogen without any deleterious effects on corrosion resistance or etch resistance. In one embodiment, the coating layer contains up to about 20 atomic percent (atom %) of hydrogen and/or oxygen. In another embodiment, the protective coating 25 comprises hydrogen and/or oxygen up to about 10 atom %.

The protective coating layer 25 is deposited onto the wafer processing apparatus by processes known in the art, including thermal/flame spray, plasma discharge spray, sputtering (particularly for glass-based compositions), expanding thermal plasma (ETP), ion plating, chemical vapor deposition (CVD), plasma enhanced chemical vapor deposition (PECVD), metal organic chemical vapor deposition (MOCVD) (also called Organometallic Chemical Vapor Deposition (OMCVD)), metal organic vapor phase epitaxy (MOVPE), physical vapor deposition processes such as sputtering, reactive electron beam (e-beam) deposition, and plasma spray. Exemplary processes are thermal spray, ETP, CVD, and ion plating.

The thickness of the protective coating layer 25 varies depending upon the application and the process used, e.g., CVD, ion plating, ETP, etc, varying from 1 μm to a few hundred μm, depending on the application. Longer life cycles are generally expected when thicker protective layers are used.

Optimized Electrode Pattern Design: The electrode pattern design of heating elements in a wafer processing apparatus directly affects the performance of the heating unit, which is defined as ramp rate, operating temperature, and most importantly temperature uniformity. In one embodiment, the wafer processing apparatus electrode is designed for highly uniform heating and minimal localized non-uniform conditions, accommodating design variables such as tabs and through-holes, pin holes, support holes, etc. By uniform heating, it means the temperature variation of the surface area where the wafer would be placed is limited to <=5° C. for a heater having an operating temperature of >=600° C. in one embodiment, and in a second embodiment <=3° C. Temperature variation means the difference between a maximum temperature point and a minimum temperature point on the wafer surface area.

In a typical wafer processing apparatus, locally cold areas may occur on the heater surface, e.g., around contact areas, electrical connections, and through-holes, due to the lack of heat generated by the electrode. In one embodiment of the present invention, the electrode is designed to compensate for the heat loss by generating more heat near or around those areas, providing maximum temperature uniformity without the typical local hot spots due to over-compensation and electric current concentration at locations where large curvatures, or sharp corners, occur in the heating element patterns of the prior art. In another embodiment of the optimized design, the resistance of heating element closely matches the impedance of the power supply for higher efficiency, especially when higher operating temperature or higher electrical power is required.

In one embodiment to achieve required temperature uniformity, the electrode pattern is designed such that the power density generated by the electrode matches the heat loss defined by the heat transfer boundary conditions of the heater. An example of a typical heat transfer boundary condition is the additional edge heat loss of the heater. In the present invention, the heat loss is addressed by providing higher power density near the edge of the heater, taking into account heat losses by functional members of a heater including but not limited to, holes, tabs on the edge of the heater, contacts to the electrode, or inserts in the substrate to meet other functional requirements of the heater.

Besides the heat loss issue, the stress concentration sometimes becomes elevated in the areas adjacent to the functional members such as tabs, through-holes, etc., where the electrode pattern path widths change and with sharp turns for better uniform temperature. The stress concentration is also aggravated by locally higher temperature gradient in and around these areas. In one embodiment of the invention, the electrode pattern is optimized by increasing the radius of the upper corners of the electrode pattern in manufacturing processes, thus alleviating the stress concentration to avoid possible failures downstream in operation due to cracks and peeling in the overcoating layer 25.

Embodiments of the optimized electrode design of the invention are further illustrated as follows with references to the figures.

Figure 1:
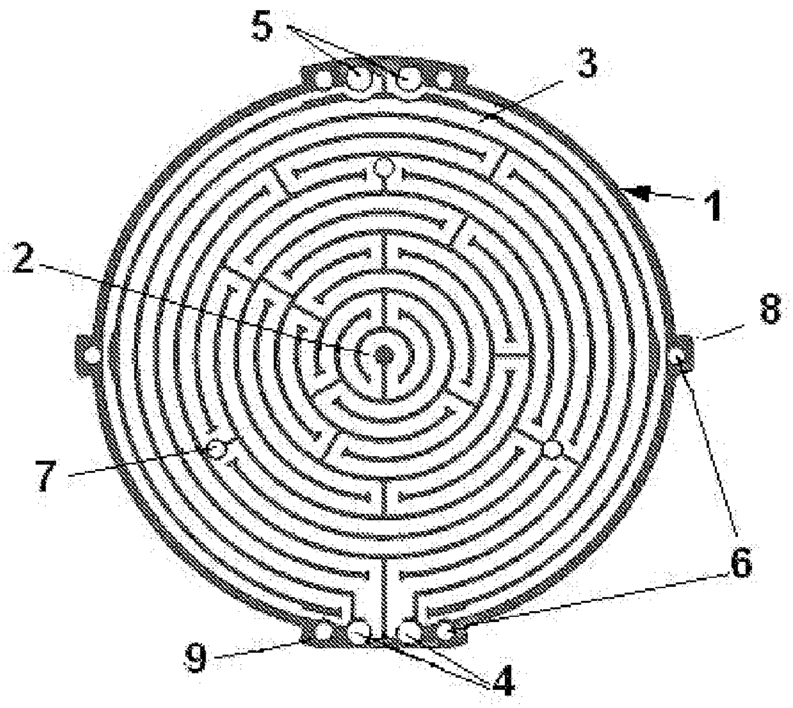
FIG. 1 is a schematic diagram showing the configuration for one embodiment of the invention, for a circuit pattern of a heating resistor.

FIG. 1 is a schematic diagram showing the configuration for one embodiment of the invention, of a top view of a heater having an optimized electrode pattern 1. As shown, there are two zones to the heating resistor, inner zone 2 and outer zone 3. The multiple zone of electrode patterns helps compensate the peripheral edge heat loss and provide better control on temperature uniformity in radial direction of the heater. Electrical power supplies are connected to the electrode to inner zone 2 via two inner zone contacts 4 and two outer zone contacts 5, respectively. Additionally, the heater plate also contains six supporting holes 6 in the tabs 8 and 9 and three lift pin holes 7 for the wafer process requirement.

In the figures, the functional members in the form of contacts 4 and 5 and the through-holes 6 and 7 are circular in shape. However, they can be of any suitable geometry depending on their function, location, and the heater application. The shortest dimension of each of the functional member is defined as "X," which is the diameter of the circular functional members or the width of the tabs as illustrated in the figures. A segment is meant a position on the electrode path.

Figure 2:
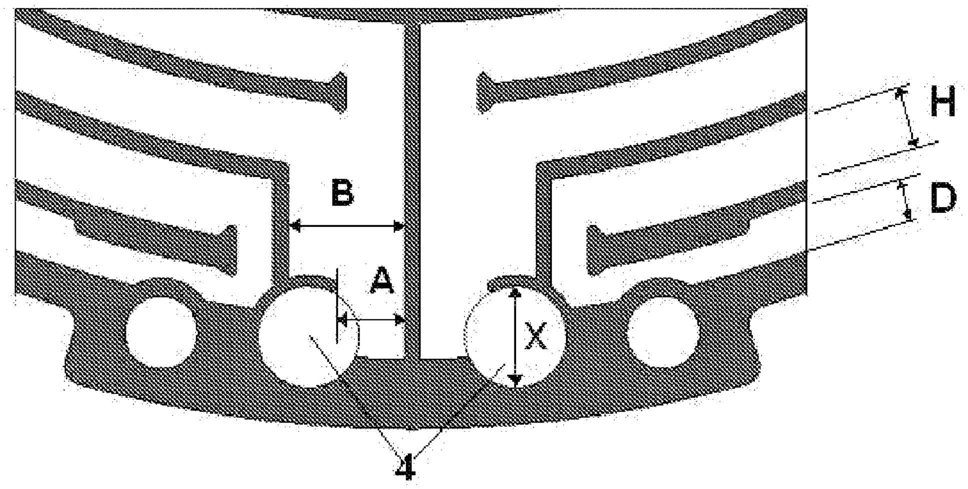
FIG. 2 is a schematic diagram of a partial section of FIG. 1, showing the circuit pattern at the contact tab of the inner zone.

FIG. 2 is a schematic diagram of a partial section of FIG. 1, showing the circuit pattern at the peripheral edge of the inner zone contact tab, wherein electrical power is supplied to the inner zone through contact areas 4. As illustrated, the outermost path D has a reduced width of 0.6 to 0.95 of the width H further away from the edge of the heater to compensate for the additional peripheral edge heat loss. There is little heat generated in the contact areas 4, and more heat loss due to the heat sink from the contact terminals. To compensate for less heat generation and more heat loss, more heat is provided by the optimized circuit pattern by reducing the electrode path width A where the electrode is connected to the contact areas. In one embodiment of the invention, at least one segment of the electrode path A has a width size of 0.45 to 0.80 of the width of electrode path B, where B is the path width leading to the contacts at a location of at least 1X away from the edge of the contact hole 4 in one embodiment, and at least 3X away in another embodiment. As used herein, at least a segment of electrode path A refers to any position that is within 2X from the edge of the contact hole 4 in one embodiment, and within 1X of the edge of the contact hole 4 in another embodiment.

Figure 3:
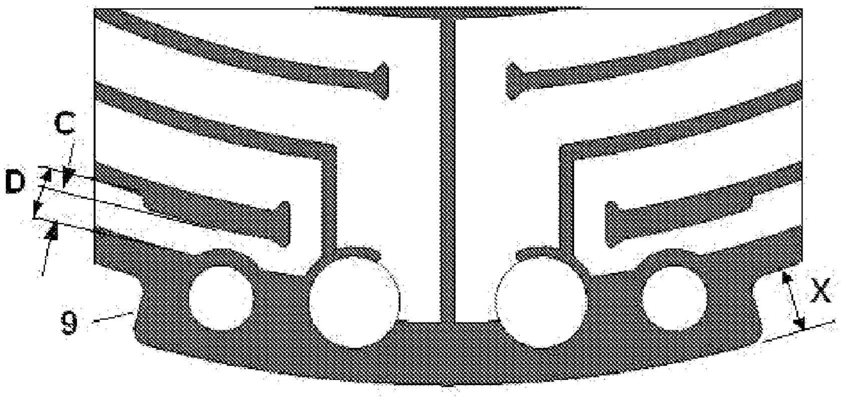
FIG. 3 is a schematic diagram of another partial section of FIG. 1, showing the electrode pattern at the contact tabs.

FIG. 3 is a schematic diagram of another partial section of one embodiment of the optimized electrode pattern in FIG. 1, showing the electrode pattern for relatively large contact tabs. Tabs are functional components of a heater, extending from a peripheral edge of the heater. As illustrated and to compensate for the additional heat loss through the contact tabs 9, the outermost electrode path width C of the electrode at contact tabs 9 is narrowed for more local heat generation. In one embodiment, the ratio of width C over a normal-path width D ranges from 0.50 to 0.95. In a second embodiment, the ratio of C:D is in the range of 0.60 to 0.75. D is the width of the electrode path leading to the tab, at a distance of at least 3X from the edge of the tab, and wherein X is the width of the tab. The reduction in the electrode path allows more heat to be generated to compensate for the heat losses due to heat sink at the contact tabs.

Figure 4:
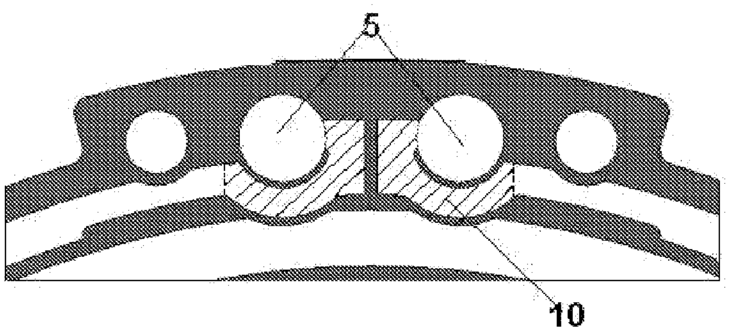
FIG. 4 is a yet another schematic diagram of partial section of FIG. 1, showing the circuit pattern at a contact tab at an outer zone.

FIG. 4 is a yet another schematic diagram of partial section of FIG. 1, showing the circuit pattern at a contact tab at an outer zone. In the figure, electrical power is conducted to the outer zone through contact areas 5. As illustrated in the optimized design, the electrode path (shaded area) 10 runs toward the center of the two contacts and then around the contacts to generate more heat required for the contact areas.

Figure 5A:
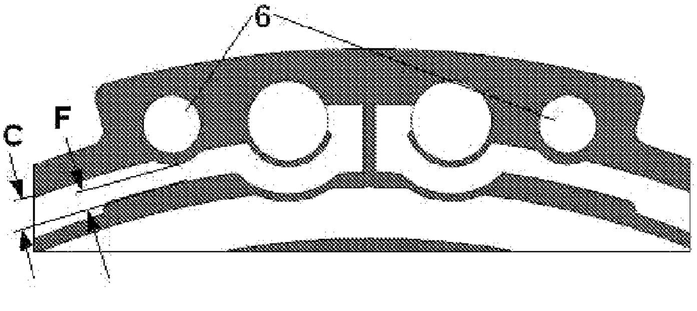
FIGS. 5A and 5B are schematic diagrams of partial sections of FIG. 1, showing the electrode pattern at supporting holes located on the tabs of the heater.
Figure 5B:
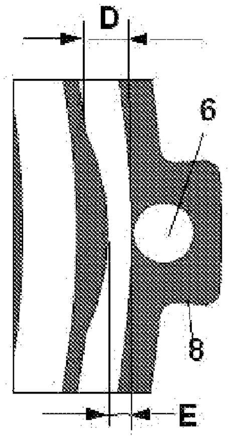

FIGS. 5A and 5B are schematic diagrams of partial sections of FIG. 1, showing the electrode pattern at supporting holes located on the tabs of the heater. In the figures, the path width F at holes 6 on the contact tabs 8 and the path width E are both reduced from their respective normal path width C and D for more heat generation. C and D respectively are measured at a distance of least 3X leading to the edge of support hole 6.

In one embodiment, the ratio of F:C and E:D ranges from 0.40 to 0.75. In a second embodiment, the ratio of F:C or E:D is in the range of 0.50 to 0.65. With the optimized design of the invention, cold spots at the holes thus are eliminated through thermal conduction to the hole areas and thermal diffusion through the heater thickness.

The width of E or F used ratios herein refers to the width of any segment of E or F, which segment is meant any position of electrode path E or F that is within 2X from the edge of the hole in one embodiment, and within 1X in another embodiment.

Figure 6A:
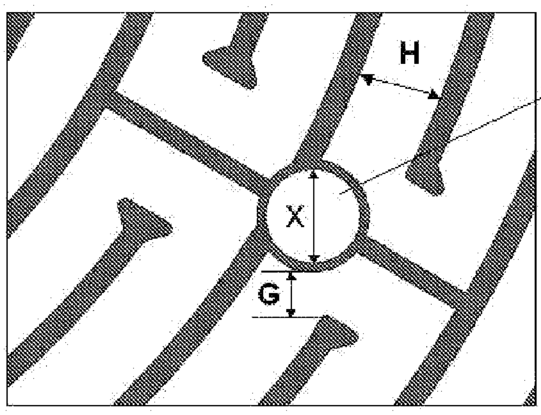
FIGS. 6A and 6B are schematic diagrams of partial sections of FIG. 1, showing the electrode pattern design around the lift pin holes.
Figure 6B:
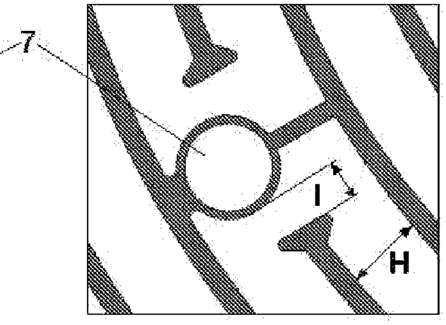

FIGS. 6A and 6B are schematic diagrams of more partial sections of FIG. 1, showing the electrode pattern design around the lift pin holes 7. FIG. 6A shows a lift hole 7 in the middle of the electrode pattern. When holes 7 are in the middle of the electrode pattern, the electrode paths are optimized to meet and turn back in opposite direction at the holes for the following benefits: a) avoiding hot spots around larger holes as caused by very narrow electrode path width due to the space limitation the electrode path to pass through; and b) affording the flexibility to adjust the path width or power density around the holes so that the optimal temperature uniformity can be achieved. As shown in the figures, the electrode paths are arranged allowing the flexibility to adjust the path widths G in FIGS. 6A and I in FIG. 6B, wherein the width reduction ratios depends on the location and size of the holes.

In one embodiment where the lift hole 7 is located near the corner of the path bend, the ratio of the reduced width G over the normal-path width H ranges from 0.35 to 0.70. H is the width of the electrode path leading to the lift hole 7, at a distance of at least 3X from the edge of the lift hole 7. In a second embodiment, the ratio G:H ranges from 0.45 to 0.65.

In one embodiment wherein the pin hole 7 is more toward the center of the path bend, the ratio of the reduced width I over the normal width H ranges from 0.30 to 0.60. In a second embodiment, the ratio I:H ranges from 0.40 to 0.50.

The width of G or I used ratios herein refers to the width of any segment of G or I, which segment is meant any position of electrode path G or I that is within 2X from the edge of the hole in one embodiment, and within 1X from the edge of the hole in another embodiment.

Figure 7:
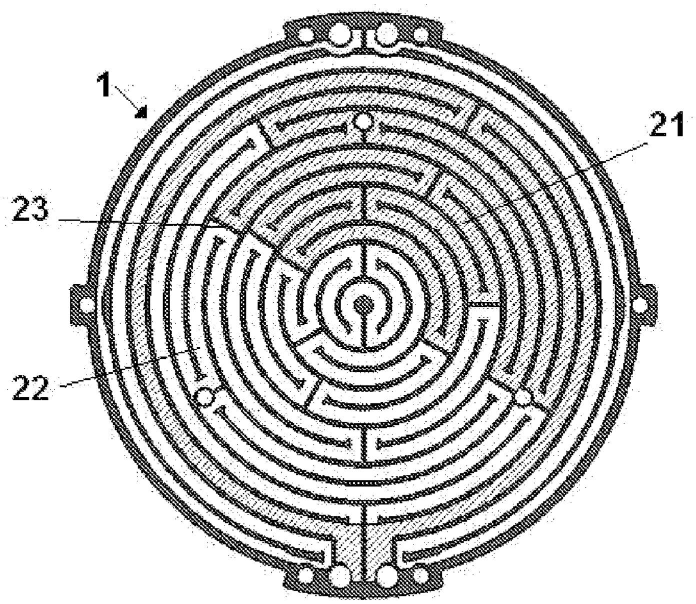
FIG. 7 is a schematic diagram showing a configuration of a second embodiment of a circuit pattern, having electrical resistance balance on parallel paths.

FIG. 7 is a schematic diagram showing a configuration of a second embodiment of a circuit pattern, having electrical resistance balance on parallel paths. In the figure, the inner electrode has two paths 21 and 22 in parallel to meet the design requirement for total electrical resistance. Both parallel paths have approximately equal resistance to allow equal power input density on both covered areas, therefore, achieving temperature uniformity. The equal resistance of both paths is realized by adjusting at least one of the adjacent location of two parallel paths where they meet, which is line 23 in the figure. In one embodiment wherein the upper right area covered by path 21 is hotter than the area covered by path 22, line 23 is rotated counter clockwise to increase the electrical resistance of path 21 and reduce the electrical resistance of path 22 until a uniform temperature is reached.

In a typical heater, the parallel paths of the electrode are not symmetric or not identical to each other due to their electrical contact locations. In one embodiment of the heater with a parallel path design having balanced electrical resistance in the parallel paths, the electrical resistance of the electrode is optimized to match the impedance of a typical power supply for higher efficiency. Furthermore, the relatively balanced resistances (or equal resistance) of the two parallel paths by adjusting at least one location where two paths meet from opposite directions allows uniform temperature and heating of the wafer substrate.

In computer simulations, i.e., Finite Element Analysis (FEA) thermal modeling, of the top surface of ceramic heaters having the optimized electrode pattern on the backside, temperature variation of the surface area where the wafer would be placed is limited to <=2° C. for a heater having an operating temperature of 600° C.

This written description uses examples to disclose the invention, including the best mode, and also to enable any person skilled in the art to make and use the invention. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

All citations referred herein are expressly incorporated herein by reference.

The invention claimed is:

1. A wafer processing apparatus comprising a disk-shaped substrate whose top surface serves as a wafer supporting surface and a conductive electrode contained within the disk-shaped substrate, wherein the top surface contains at least a functional member having a shortest dimension X, the functional member is one of electrical contacts, tabs, inserts, and through-holes;

the conductive electrode having a configured path of a predetermined pattern, the electrode is connected to an external source of power for heating a wafer disposed on the wafer supporting surface; and within a distance of 1 X of the functional member, at least one segment of the conductive electrode has a reduced path width of 0.2 to 0.95 of the electrode path width of a segment of the conductive electrode at a distance at least 3X from the functional member.

2. The wafer processing apparatus of claim 1, wherein the conductive electrode defines at least two heating zones, an inner path and an outer path, and wherein the electrode in the outer path has an average width of 0.60 to 0.95 of the average width of the electrode in the inner path.

3. The wafer processing apparatus of claim 1, wherein the top surface contains at least an electrical contact and wherein the conductive electrode within a distance of IX from the electrical contact is connected to the contact from one side of the contact and circling around the contact if there is adequate space near the contact areas.

4. The wafer processing apparatus of claim 1, wherein the top surface contains at least an electrical contact and wherein at least one segment of the conductive electrode at a distance within IX from the electrical contact has a reduced path width of 0.45 to 0.8 the width of a segment of the electrode at a distance of at least 3X from the electrical contact.

5. The wafer processing apparatus of claim 1, wherein the top surface contains at least a tab extending from one peripheral edge of disk-shaped substrate, and wherein at least one segment of the conductive electrode at a distance within IX from the tab has a reduced path width of 0.5 to 0.95 the width of a segment of the electrode path at a distance of at least 3 X from the tab.

6. The wafer processing apparatus of claim 1, wherein the top surface contains at least a through-hole, and wherein at least one segment of the conductive electrode at a distance within IX from the through-hole has a reduced path width of 0.4 to 0.75 the width of a segment of the electrode path at a distance of at least 3 X from the through-hole.

7. The wafer processing apparatus of claim 1, wherein the top surface contains at least a through-hole and wherein the conductive electrode defines at least two paths which meet and turn back in opposite directions at the through-hole and wherein at least one segment of the conductive electrode at a distance within IX from the through-hole has a reduced path width of 0.3 to 0.7 the width of a segment of the electrode path at a distance of at least 3 X from the through-hole.

8. The wafer processing apparatus of claim 1, wherein the difference between a maximum temperature point and a minimum temperature point on the wafer surface area is less than 5° C. for a heater having an operating temperature of at least 600° C.

9. The wafer processing apparatus of claim 8, wherein the difference between a maximum temperature point and a minimum temperature point on the wafer surface area is less than 2° C. for a heater having an operating temperature of 600° C.

10. The wafer processing apparatus of claim 1, wherein the disk-shaped substrate is a multiple-layered substrate comprising: a) a base substrate comprising at least one of graphite, refractory metals, transition metals, rare earth metals and alloys thereof; b) an electrically insulating layer deposited upon the base substrate, the layer comprises at least one of an oxide, nitride, oxynitride of elements selected from a group consisting of Al, B, Si, Ga, refractory hard metals, transition metals, and combinations thereof; and c) at least an overcoating layer comprising at least one of a nitride, carbide, carbonitride, oxynitride of elements selected from a group consisting of B, Al, Si, Ga, refractory hard metals, transition metals, and combinations thereof;

wherein the conductive electrode is disposed on the electrically insulating layer, and wherein the conductive electrode has a coefficient of thermal expansion (CTE) in a range of 0.75 to 1.25 times that of the electrically insulating layer and the overcoating layer respectively.

11. The wafer processing apparatus of claim 10, wherein the multiple-layered substrate further comprises a tie-layer comprising at least one of a nitride, carbide, oxide, oxynitride of elements selected from Al, Si, refractory metals, transition metals, and combinations thereof; wherein the tie-layer is deposited upon the base substrate and disposed between the base substrate and the electrically insulating layer.

12. The wafer processing apparatus of claim 1, wherein the disk-shaped substrate comprises a high temperature material and where the conductive electrode is embedded within a metal substrate.

13. The wafer processing apparatus of claim 1, wherein the disk-shaped substrate is a multiple-layered substrate comprising: a) a base substrate comprising at least one of an oxide, nitride, oxynitride of elements selected from a group consisting of Al, B, Si, Ga, refractory hard metals, transition metals, and combinations thereof; b) an electrically insulating layer deposited upon the base substrate, the layer comprises at least one of an oxide, nitride, oxynitride of elements selected from a group consisting of Al, B, Si, Ga, refractory hard metals, transition metals, and combinations thereof; and c) at least an overcoating layer comprising at least one of a nitride, carbide, carbonitride, oxynitride of elements selected from a group consisting of B, Al, Si, Ga, refractory hard metals, transition metals, and combinations thereof;

wherein the conductive electrode is disposed on the electrically insulating layer, and wherein the conductive electrode has a coefficient of thermal expansion (CTE) in a range of 0.75 to 1.25 times that of the electrically insulating layer and the overcoating layer respectively.

14. The wafer processing apparatus of claim 1, wherein the conductive electrode comprises one of graphite, a high melting point metal alloy, a noble metal, and a noble metal alloys.

15. The wafer processing apparatus of claim 14, wherein a coating layer comprises aluminum nitride, and wherein the coating layer is deposited on the conductive electrode by at least one of ETP, CVD and ion plating.

16. The wafer processing apparatus of claim 1, wherein the disk-shaped substrate comprises aluminum nitride.

17. The wafer processing apparatus of claim 1, wherein the disk-shaped substrate comprises a sintered ceramic material containing 45 to 5% by weight of AlN to 55 to 95% by weight of BN.

18. The wafer processing apparatus of claim 8, wherein the difference in the resistance of the paths is maintained at less than 1% by adjusting at least one location where two paths meet from opposite directions.

* * * * *